United States Patent
Uziel

(10) Patent No.: US 6,908,567 B2
(45) Date of Patent: Jun. 21, 2005

(54) CONTAMINANT REMOVAL BY LASER-ACCELERATED FLUID

(75) Inventor: Yoram Uziel, Post Misgav (IL)

(73) Assignee: Applied Materials Israel, Ltd., Rehovot (IL)

( * ) Notice: Subject to any disclaimer, the term of this patent is extended or adjusted under 35 U.S.C. 154(b) by 316 days.

(21) Appl. No.: 10/209,506

(22) Filed: Jul. 30, 2002

(65) Prior Publication Data

US 2004/0020898 A1 Feb. 5, 2004

(51) Int. Cl.[7] .............................................. B44C 1/22
(52) U.S. Cl. ........................... 216/66; 216/60; 216/65; 134/1.1
(58) Field of Search ............................. 216/60, 62, 65, 216/66; 219/121.4, 121.6, 121.84, 121.85; 134/1.1, 1.2, 1.3, 11

(56) References Cited

U.S. PATENT DOCUMENTS

| | | |
|---|---|---|
| 4,903,717 A | 2/1990 | Sumnitsch |
| 4,980,536 A | 12/1990 | Asch et al. |
| 4,987,286 A * | 1/1991 | Allen .................... 219/121.68 |
| 5,023,424 A | 6/1991 | Vaught |
| 5,024,968 A | 6/1991 | Engelsberg |
| 5,099,557 A | 3/1992 | Engelsberg |
| 5,542,441 A | 8/1996 | Mohindra et al. |
| 5,669,979 A * | 9/1997 | Elliott et al. .................... 134/1 |
| 5,845,662 A | 12/1998 | Sumnitsch |
| 5,896,877 A | 4/1999 | Pirker |
| 5,950,645 A | 9/1999 | Olesen et al. |
| 5,961,732 A | 10/1999 | Patrin et al. |
| 6,149,759 A | 11/2000 | Guggenberger |
| 6,295,999 B1 | 10/2001 | Bran |
| 6,627,846 B1 * | 9/2003 | Yogev et al. .......... 219/121.85 |

FOREIGN PATENT DOCUMENTS

DE 198 01 360 A1 7/1999

* cited by examiner

Primary Examiner—Lan Vinh
(74) Attorney, Agent, or Firm—Moser, Patterson & Sheridan LLP

(57) ABSTRACT

A method for removing a particle from a substrate includes forming a layer of a fluid on a surface of an optical element and positioning the optical element in proximity to a location of the particle on the substrate. A pulse of electromagnetic radiation is directed to impinge on the surface of the optical element so as to induce explosive evaporation of the fluid thereon, whereby a pressure wave is emitted toward the location of the particle.

13 Claims, 2 Drawing Sheets

CONTAMINANT REMOVAL BY LASER-ACCELERATED FLUID

FIELD OF THE INVENTION

The present invention relates generally to processing of semiconductor devices, and specifically to methods and apparatus for removal of foreign particles and other contaminants from solid-state surfaces.

BACKGROUND OF THE INVENTION

Removal of particles and other contaminants from solid-state surfaces is a major problem in integrated circuit manufacture. Integrated circuit manufacture includes, but is not limited to, production of semiconductor wafers, printed circuit boards, component packaging, and the like. As the trend to miniaturize electronic devices and components continues, and critical dimensions of circuit features become ever smaller, the presence of even a minute foreign particle on a wafer substrate during processing can cause a fatal defect in the circuit. Similar concerns affect other elements used in the manufacturing process, such as photomasks and reticles.

Various methods are known in the art for stripping and cleaning foreign matter from the surfaces of wafers and masks, while avoiding damage to the surfaces themselves. For example, U.S. Pat. No. 4,980,536 to Asch et al., whose disclosure is incorporated herein by reference, describes a method and apparatus for removal of particles from solid-state surfaces by laser bombardment. U.S. Pat. Nos. 5,099,557 and 5,024,968 to Engelsberg, whose disclosures are also incorporated herein by reference, describe methods and apparatus for removing surface contaminants from a substrate by high-energy irradiation. The substrate is irradiated by a laser with sufficient energy to release the particles, while an inert gas flows across the wafer surface to carry away the released particles.

U.S. Pat. No. 4,987,286 to Allen, whose disclosure is likewise incorporated herein by reference, describes a method and apparatus for removing minute particles (even sub-micron particles) from a surface to which they are adhered. An energy transfer medium, typically a fluid, is interposed between each particle to be removed and the surface. The medium is irradiated with laser energy, and absorbs sufficient energy to cause explosive evaporation, thereby dislodging the particles.

U.S. Pat. No. 5,023,424 to Vaught, whose disclosure is incorporated herein by reference, describes a method and apparatus for using laser-induced shock waves to dislodge particles from a wafer surface. A particle detector is used to locate the positions of particles on the wafer surface. A laser beam is then focused at a point above the wafer surface near the position of each of the particles, in order to produce gas-borne shock waves with peak pressure gradients sufficient to dislodge and remove the particles.

U.S. Pat. No. 5,961,732 to Patrin et al., whose disclosure is incorporated herein by reference, describes a method for forming a cryogenic aerosol by expanding a pressurized liquid or liquid/gaseous stream of one or more cryogens through a nozzle into a process chamber. The expansion and/or evaporation causes cooling of the cryogens, leading to formation of a stream of solid aerosol particles. The aerosol is directed at a substrate in order to remove contaminants from the surface.

U.S. Pat. No. 6,295,999 to Bran, whose disclosure is incorporated herein by reference, describes a method for cleaning semiconductor wafers, by using megasonic energy to agitate cleaning fluid applied to the wafer. A source of energy vibrates an elongated probe, which transmits the acoustic energy into the fluid. In one arrangement, fluid is sprayed onto both sides of a wafer while a probe is positioned close to an upper side of the wafer. In another arrangement, a short probe is positioned with its end face close to the surface of a wafer, and the probe is moved over the wafer as it rotates.

SUMMARY OF THE INVENTION

It is an object of some aspects of the present invention to provide improved apparatus and methods for removing particles and other contaminants from a substrate.

In preferred embodiments of the present invention, an optical element, such as the exit face of a light guide, is positioned in proximity to a particle on a substrate, such as a semiconductor wafer or photomask. Preferably, the location of the particle is determined in advance, using methods of defect localization and classification known in the art. A film of fluid, such as water, is formed on the surface of the optical element adjacent to the particle, preferably by condensation from a flow of a humid gas mixture over the substrate. A beam of intense electromagnetic radiation, typically from a pulsed laser, strikes the optical element and is absorbed by the fluid film thereon. The absorption causes explosive evaporation of the fluid, creating a pressure wave that strikes the substrate and dislodges the particle. Preferably, a suction nozzle in the vicinity of the particle location carries the particle and excess fluid away from the surface.

Preferably, the optical element and laser beam (or other energy source) are arranged so that little or none of the radiation actually strikes the substrate. Preferred embodiments of the present invention thus afford the enhanced contaminant removal capabilities of laser-based cleaning systems, while avoiding possible radiation damage that such systems can cause to sensitive substrates.

There is therefore provided, in accordance with a preferred embodiment of the present invention, apparatus for removing a particle from a substrate, including:

forming a layer of a fluid on a surface of an optical element;

positioning the optical element in proximity to a location of the particle on the substrate; and directing a pulse of electromagnetic radiation to impinge on the surface of the optical element so as to induce explosive evaporation of the fluid thereon, whereby a pressure wave is emitted toward the location of the particle.

Preferably, the optical element includes a radiation guide, and the surface of the optical element includes an exit face of the guide, wherein directing the pulse of the radiation includes passing the radiation through the guide. Most preferably, the radiation guide includes an infrared-transmitting material, and passing the radiation through the guide includes passing infrared laser radiation through the guide. Additionally or alternatively, positioning the optical element includes positioning the radiation guide so that a longitudinal axis of the guide is generally parallel to the substrate, and the exit face of the guide is inclined toward the substrate at an acute angle relative to the axis.

Further preferably, directing the pulse of the radiation includes directing the radiation at an angle relative to the substrate such that the radiation is substantially not incident on the substrate. Most preferably, directing the radiation includes directing the radiation to pass through the optical element, and positioning the optical element includes inclining the element at an angle relative to the substrate, so that after passing through the element, the radiation is refracted away from the substrate.

Preferably, forming the layer of the fluid includes causing a gas mixture containing the fluid in a vapor form to flow over the surface, so that the fluid condenses on the surface and, most preferably, so that the fluid further condenses on the substrate in a vicinity of the particle. In a preferred embodiment, the fluid includes water.

Typically, positioning the optical element includes determining coordinates of the particle using an inspection system, and positioning the optical element responsive to the coordinates.

Preferably, the pressure wave causes the particle to be dislodged from the substrate, and the method includes applying suction in a vicinity of the particle so as to remove the dislodged particle. Most preferably, forming the layer, directing the pulse, and applying the suction include performing successive steps of forming the layer, directing the pulse, and applying the suction repetitively in sequence.

In a preferred embodiment, the surface of the optical element includes one or more surfaces arranged so as to surround a central point, and positioning the optical element includes positioning the optical element so that the central point approximately coincides with the location of the particle, whereby when the pulse of electromagnetic radiation impinges on the one or more surfaces, the pressure wave is emitted toward the location from multiple directions.

There is also provided, in accordance with a preferred embodiment of the present invention, apparatus for removing a particle from a substrate, including:

an optical element having a surface;

a positioning system, coupled to position the optical element in proximity to a location of the particle on the substrate;

a fluid inlet, adapted to release a fluid so as to form a layer of a fluid on the surface of the optical element; and a radiation source, adapted to direct a pulse of electromagnetic radiation to impinge on the surface of the optical element so as to induce explosive evaporation of the fluid thereon, whereby a pressure wave is emitted toward the location of the particle.

The present invention will be more fully understood from the following detailed description of the preferred embodiments thereof, taken together with the drawings in which:

DETAILED DESCRIPTION OF A PREFERRED EMBODIMENT

Figure 1:
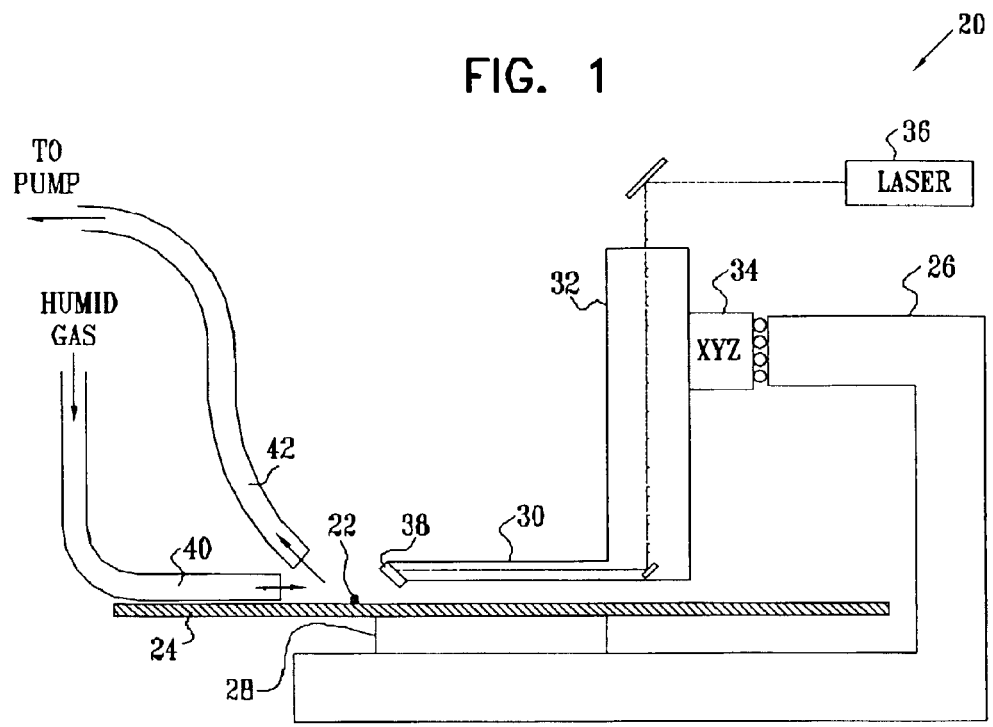
FIG. 1 is a schematic side view of apparatus for removal of a particle from a substrate, in accordance with a preferred embodiment of the present invention.

FIG. 1 is a schematic side view of a system 20 for removal of a particle 22 from a substrate 24, in accordance with a preferred embodiment of the present invention. Typically, substrate 24 comprises a semiconductor wafer, photomask or other item used in manufacturing semiconductor devices, although the methods embodied in system 20 may also be applied to cleaning substrates of other types. The substrate is supported by a chuck 28, typically a rotating chuck that is a part of a motion control system 26. The substrate and associated elements shown in FIG. 1 are typically contained in a process chamber, not shown in the figures, as is known in the art of semiconductor device manufacture.

For optimal operation of system 20, it is desirable to know the coordinates of particle 22 with high accuracy, preferably to within ±5 $\mu$m. This level of accuracy is typically provided by wafer inspection tools such as the Tencor 7200 system (KLA-Tencor, San Jose, Calif.), or the "Excite" inspection system (Applied Materials, Santa Clara, Calif.), as well as other inspection systems known in the art. Inspection is typically performed using dark-field optical detection, with analysis of the intensity and pattern of radiation scattered from the substrate to locate and classify defects, such as particle 22, on substrate 24. For patterned substrates, techniques such as die-to-die subtraction may be used to distinguish the scattered signal due to the substrate pattern from that due to defects.

Particle 22 is removed from substrate 24 by operation of a laser 36, whose beam is directed to the vicinity of the particle by an optical head 32. The optical head comprises a light guide 30, which is manipulated by a high-resolution positioning stage 34. Preferably, stage 34 comprises an XYZ stage, with positioning resolution <1 $\mu$m on each axis, and most preferably with resolution of about 0.1 $\mu$m on each axis. Stage 34 is capable of positioning an exit face 38 of light guide 30 reliably to within 10 $\mu$m of particle 22. Alternatively, optical head 32 may be stationary, and motion control system 26 may move substrate 24, instead. Details of the construction of light guide 30 are described below. For clarity of illustration, light guide 30 and other elements in the vicinity of particle 22 are not drawn to scale in the figures.

Prior to firing laser 36, a flow of humidified gas is introduced into the process chamber via a gas inlet assembly 40. Typically, the humidified gas flow contains a vaporized liquid, such as water, a solvent, or an aqueous solution. The liquid is heated so as to be partially or fully vaporized or to enter a gaseous phase. The humidified gas flow may thus also comprise steam. Further aspects of this fluid delivery system are described in U.S. application Ser. No. 10/035972 filed Nov. 9, 2001 titled "Condensation based enhancement of particle removal by suction" which is assigned to the assignee of the present patent application and whose disclosure is incorporated herein by reference. As shown below in FIG. 2, the heated fluid carried by the gas flow cools and condenses on exit face 38 of light guide 30, as well as on particle 22 and the surrounding substrate 24.

When laser 36 is fired, the laser radiation is absorbed by the condensed fluid on face 38, causing the fluid to evaporate explosively. The pressure wave from the light guide exit surface strikes particle 22 and, in most cases, dislodges the particle from substrate 24. The released particle, along with the excess fluid from the substrate, is removed by a suction nozzle 42. The suction nozzle is typically connected to a suitable vacuum or displacement pump (not shown). Preferably, pulsed suction is applied to nozzle 42, in synchronization with the laser pulse. Most preferably, the process steps are performed sequentially: injecting humidified gas, firing laser, and then suction, at regular intervals, typically of about 100 ms. The gas inlet and suction channels may be coaxial, as described in the above-mentioned patent application.

Figure 2:
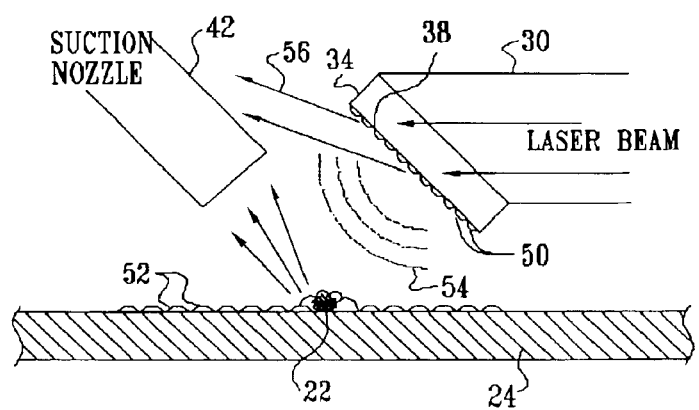
FIG. 2 is a schematic detail view of the apparatus of FIG. 1.

FIG. 2 is a schematic detail view showing the vicinity of particle 22 in system 20, in accordance with a preferred embodiment of the present invention. As shown in the figure, a liquid film 50 is formed on face 38 prior to firing the laser. A further liquid film 52 is formed over and around particle 22 on substrate 24. Film 52 both helps to loosen the particle from the surface and absorbs, at least in part, laser radiation that may pass face 38 and strike substrate 24. This absorption is useful both in protecting the substrate and in conveying further energy to release particle 22 from the substrate.

When the laser beam strikes face 38, film 50 explosively evaporates, causing a pressure wave 54 to propagate toward particle 22. The inventors have found that the pressure differential of the wave typically reaches about 10 atm. As shown in the figure, face 38 is preferably inclined toward substrate 24 at an acute angle to the longitudinal axis of light guide 30, most preferably at an angle of about 45°. The inclination of the exit face of light guide 30 has two useful effects:

1. It causes pressure wave 54 to be directed toward substrate 24.
2. It causes a transmitted portion 56 of the laser beam (which is not absorbed by film 50) to be refracted away from substrate 24, thus further reducing the likelihood of radiation damage to the substrate.

For optimal absorption in the laser radiation in film 50, assuming water to be the main (or only) ingredient in the film, the wavelength of the laser beam is preferably around 3 $\mu$m. For optimal explosive effect, the energy density of the laser pulse at face 38 is preferably between about 100 and 700 mj/cm$^2$, and the pulse duration is preferably between about 5 and 60 ns. An erbium laser may be used for this purpose or, alternatively, a Nd:YAG or other short-wavelength laser may be used, together with a suitable downconverter, such as an optical parametric oscillator (OPO). Suitable OPO devices for this purpose are produced by Big Sky Laser Technologies (Bozeman, Mont.), as well as by other manufacturers. For these wavelengths and the operating conditions of system 20, light guide 30 preferably comprises an infrared-transmitting material, such as a sapphire rod, between 0.1 and 0.4 mm in diameter. The light guide is preferably held so that its lower edge is about 10 $\mu$m off the surface of substrate 24, in close proximity to particle 22. Alternative optical arrangements, however, will be apparent to those skilled in the art, including different types of light guides or relay optics, as well as different types of radiation sources, wavelength ranges and pulse durations.

Figure 3A:
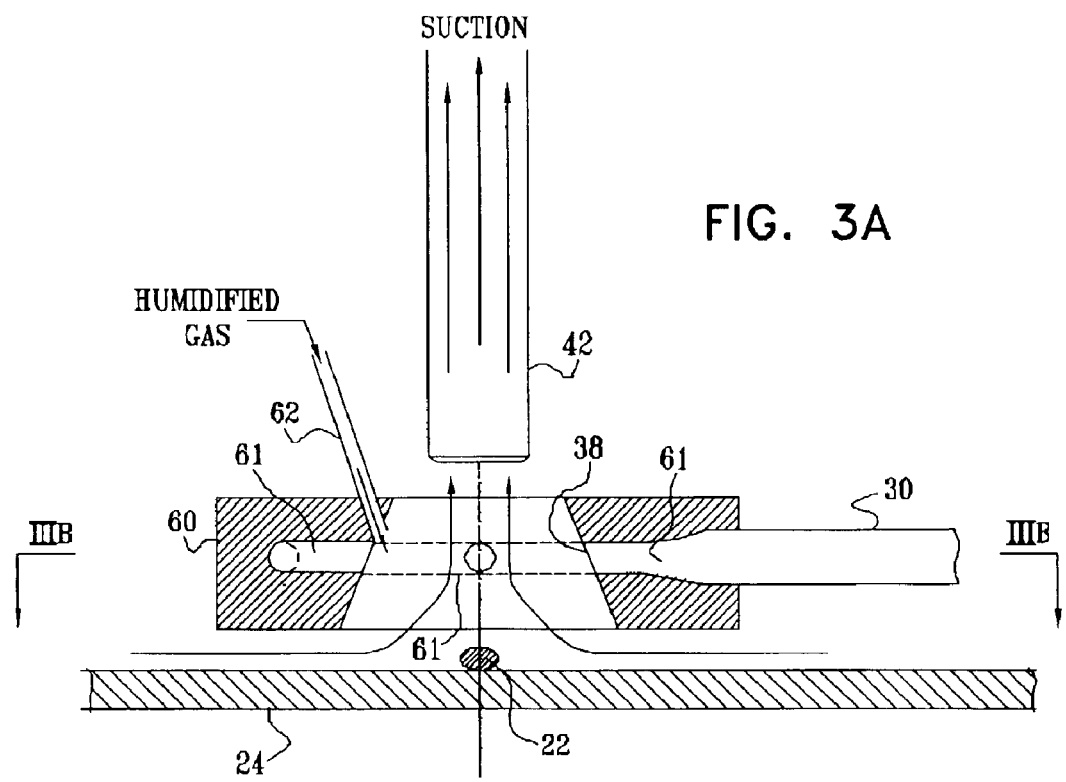
FIG. 3A is a schematic detail view of apparatus for removal of a particle from a substrate, in accordance with another preferred embodiment of the present invention.
Figure 3B:
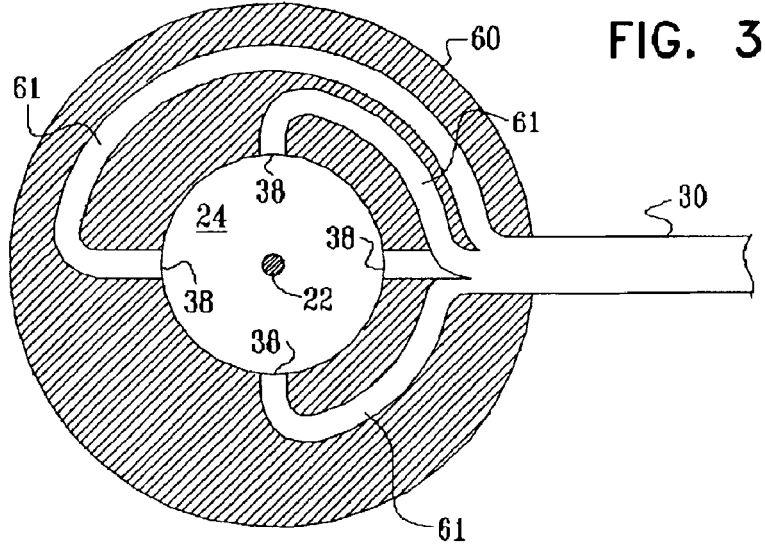
FIG. 3B is a schematic, cross-sectional view of the apparatus shown in FIG. 3A.

FIGS. 3A and 3B show an example of an alternative optical arrangement of the elements of system 20 in the vicinity of particle 22, in accordance with a preferred embodiment of the present invention. FIG. 3A is a side view showing details of the system, while 3B is a cross-sectional top view, taken along a line IIIB—IIIB in FIG. 3A. Light guide 30 terminates in a ring element 60, comprising multiple fiberoptic branches 61 that split off from light guide 30 and terminate in faces 38 at the inside of element 60. The ring element is typically positioned so that it is centered over the location of particle 22. The laser radiation passes through guide 30 into branches 61 and exits, approximately symmetrically, through faces 38 of the branches on the inside of ring element 60. As a result, the film on faces 38 explodes inward toward particle 22 from all directions.

The configuration of FIGS. 3A and 3B is advantageous particularly on patterned substrates, which typically have trenches or holes in which particles can lodge. Such particles can be more effectively and reliably dislodged when the pressure waves due to explosive evaporation impinge on the particles from multiple directions. Ring element 60 preferably includes a passage for a tube 62 for introducing the humidified gas to the inside of the ring. Suction nozzle 42 is preferably aligned with or mechanically coupled to the central aperture the ring, as shown in the figure. Alternative optical arrangements in which an annular face 38 or multiple faces 38 surround a central point coinciding with the particle location may similarly be used, in place of ring element 60 and fiberoptic branches 61.

Although a certain convenient mechanical and optical arrangement is used in the preferred embodiment described above, alternative arrangements will be apparent to those skilled in the art and are considered to be within the scope of the present invention. In particular, face 38 need not be the end of a solid light guide as described above, but may rather comprise a surface of some other optical element, which may be transmissive or reflective, and may be either flat or curved. System 20 may also be adapted for removing contaminants of other types from substrate 24, and not only particles as illustrated above.

It thus will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A method for removing a particle from a substrate, comprising:

forming a layer of a fluid on a surface of an optical element;

positioning the optical element in proximity to a location of the particle on the substrate; and directing a pulse of electromagnetic radiation to impinge on the surface of the optical element so as to induce explosive evaporation of the fluid thereon, whereby a pressure wave is emitted toward the location of the particle.

2. A method according to claim 1, wherein the optical element comprises a radiation guide, and wherein the surface of the optical element comprises an exit face of the guide, and wherein directing the pulse of the radiation comprises passing the radiation through the guide.

3. A method according to claim 2, wherein the radiation guide comprises an infrared-transmitting material, and wherein passing the radiation through the guide comprises passing infrared laser radiation through the guide.

4. A method according to claim 2, wherein positioning the optical element comprises positioning the radiation guide so that a longitudinal axis of the guide is generally parallel to the substrate, and wherein the exit face of the guide is inclined toward the substrate at an acute angle relative to the axis.

5. A method according to claim 1, wherein directing the pulse of the radiation comprises directing the radiation at an angle relative to the substrate such that the radiation is substantially not incident on the substrate.

6. A method according to claim 5, wherein directing the radiation comprises directing the radiation to pass through the optical element, and wherein positioning the optical element comprises inclining the optical element at an angle relative to the substrate so that after passing through the optical element, the radiation is refracted away from the substrate.

7. A method according to claim 1, wherein forming the layer of the fluid comprises causing a gas mixture containing the fluid in a vapor form to flow over the surface of the optical element so that the fluid condenses on the surface of the optical element.

8. A method according to claim 7, wherein the fluid further condenses on the substrate in a vicinity of the particle.

9. A method according to claim 1, wherein the fluid comprises water.

10. A method according to claim 1, wherein positioning the optical element comprises determining coordinates of the particle using an inspection system, and positioning the optical element responsive to the coordinates.

11. A method according to claim 1, wherein the pressure wave causes the particle to be dislodged from the substrate, and further comprising applying suction in a vicinity of the particle to remove the dislodged particle.

12. A method according to claim 11, wherein forming the layer, directing the pulse, and applying the suction comprise performing successive steps of forming the layer, directing the pulse, and applying the suction repetitively in sequence.

13. A method according to claim 1, wherein the surface of the optical element comprises one or more surfaces arranged to surround a central point, and wherein positioning the optical element comprises positioning the optical element so that the central point approximately coincides with the location of the particle, whereby when the pulse of electromagnetic radiation impinges on the one or more surfaces, the pressure wave is emitted toward the location from multiple directions.

\* \* \* \* \*